US007937576B2

(12) United States Patent
Bovino et al.

(10) Patent No.: US 7,937,576 B2
(45) Date of Patent: May 3, 2011

(54) CONFIGURATION OF A MULTI-LEVEL FLASH MEMORY DEVICE

(75) Inventors: Angelo Bovino, Brunico (IT); Roberto Ravasio, Ponte San Pietro (IT); Rino Micheloni, Turate (IT)

(73) Assignee: Micron Technology, Inc., Boise, ID (US)

( * ) Notice: Subject to any disclaimer, the term of this patent is extended or adjusted under 35 U.S.C. 154(b) by 916 days.

(21) Appl. No.: 11/460,777

(22) Filed: Jul. 28, 2006

(65) Prior Publication Data
US 2007/0038852 A1 Feb. 15, 2007

(30) Foreign Application Priority Data
Jul. 28, 2005 (EP) ..................................... 05425559

(51) Int. Cl.
*G06F 9/24* (2006.01)
(52) U.S. Cl. ........................... 713/1; 713/100; 365/225.7
(58) Field of Classification Search .................. 713/1, 2, 713/100; 365/225.7
See application file for complete search history.

(56) References Cited

U.S. PATENT DOCUMENTS

| 6,023,761 | A | | 2/2000 | Ott | 713/1 |
|---|---|---|---|---|---|
| 6,134,704 | A | * | 10/2000 | Adams et al. | 716/17 |
| 6,363,008 | B1 | | 3/2002 | Wong | 365/185.03 |
| 6,396,759 | B1 | * | 5/2002 | Lesher | 365/225.7 |
| 2003/0128590 | A1 | * | 7/2003 | Roohparvar | 365/185.22 |
| 2004/0153900 | A1 | * | 8/2004 | Adams et al. | 714/710 |
| 2004/0169254 | A1 | * | 9/2004 | Porter | 257/530 |
| 2005/0270879 | A1 | * | 12/2005 | Imondi | 365/225.7 |
| 2006/0023549 | A1 | * | 2/2006 | Son et al. | 365/225.7 |

FOREIGN PATENT DOCUMENTS
EP 1453062 6/2006
* cited by examiner

*Primary Examiner* — Mark Connolly
*Assistant Examiner* — Paul B Yanchus, III
(74) *Attorney, Agent, or Firm* — Schwabe Williamson & Wyatt

(57) ABSTRACT

A multi-level flash memory device allows for a faster and more effective configuration of the operating parameters of the memory device for performing the different functioning algorithms of the memory The identification of an optimal configuration of the operating parameters of the memory device during testing is simplified by allowing for a one-time processing of configuration bits into algorithm-friendly data that are stored in an embedded ancillary random access memory at every power-on of the memory device This is done by executing a specific power-on algorithm code stored in the ancillary read only memory of the embedded microprocessor.

14 Claims, 4 Drawing Sheets

CONFIGURATION OF A MULTI-LEVEL FLASH MEMORY DEVICE

FIELD OF THE INVENTION

The present invention relates to non-volatile memory devices, and more particularly, to multi-level flash memory devices embedded in a microcontroller for executing algorithm codes stored in a read only memory.

BACKGROUND OF THE INVENTION

Multi-level flash memory devices of NAND architecture are in an initial phase of development. This implies that many specific parameters of operation such as the timing of certain phases of operation, biasing voltages and the like cannot be optimally defined in the design stage before gathering clear responses from the silicon.

Therefore, in the development phase of the design of a new memory device, it is necessary to carry out the control algorithms of operation of the memory device with a sufficiently ample possibility of varying the operating parameters. All the possible alternatives of configuration should be selectable in the device in a definitive or permanent manner and/or in a test mode (non-permanent) manner in order to facilitate recognition of the most efficient settings during the testing phase.

Such an ample variability often makes the execution of the control algorithms when verifying the functioning of the memory device rather complex with inevitable negative effects on the performances of the memory device. For example, it is frequently the case in which the intervals of execution of certain phases of operation are longer than what would be necessary for a correct operation of the memory circuits. This is due to the excessively long processing times of the configuration data, which causes a decrement in performances that are not imposed by technological limits.

The problem is particularly felt if another aspect of these devices is considered, which is the need of storing information on all possible configurations. For example, in order to ensure that the charge time of a mode at a certain biasing voltage is selectable among eight different possible values, it is necessary to store at least three bits of information for indicating which, among the possible configuration choices, is the currently selected one. Therefore, three configuration fuses and/or three storage latches are required, as will be illustrated later.

By applying the same reasoning to all the parameters that would be useful to be able to select among a certain number of possible different values in order to be able to trim with a sufficient degree of freedom all the configurable parameters for optimal performances of a device, the total number of configuration bits to be stored may reach the order of several hundred. All or a good portion of these configuration bits need to be accessible to (read) by the embedded microcontroller that executes the main phases of operation (control algorithms) of the memory devices.

The burden in terms of area occupation for storing such a large number of selectable configuration bits is considerable. In fact, apart from the silicon area strictly intended for forming the fuses and/or storage latches, a significantly even larger silicon area is required for forming all the necessary connections to/from these storage elements from/to the embedded microcontroller.

Simplified functional diagrams of a typical multi-level NAND flash memory device are depicted in FIGS. 1 and 2. FIG. 1 is relative to the managing of the memory operations by the embedded micro-controller (μP) FIG. 2 is relative to the execution by the microcontroller of a certain algorithm flow (e.g., for providing a regulated biasing or control voltage to a certain node of the memory circuitry) of a value determined by the state of relative configuration fuses of the device These fuses are set during the final fuse-burning step of the testing phase at the end of the fabrication process.

Often, in order to facilitate verification and comparison of alternative configuration choices during the testing phase of the device being fabricated, a number of latches that are eventually bi-univocally associated to the same number of fuses is formed. Bit values corresponding to the ones of a selected configuration may be loaded by the external testing machine in the latches The loaded bit value of a latch is eventually XORed with the bit content of the corresponding fuse through respective selection multiplexers controlled by the embedded micro-controller of the device upon executing one of the control algorithms.

In this way, at the expense of additional silicon area required for forming a same number of latches as the contemplated number of fuses and the relative selection multiplexer and XOR gate, a preferred performing configuration of the fuses may be assessed in a quicker and easier manner before proceeding to the conditioning (burning) of the selected fuses. The burning renders the configuration of the fabricated device permanent.

SUMMARY OF THE INVENTION

An object of the invention is to provide a multi-level flash memory device having an enhanced performance by allowing for a faster and more effective configuration of the operating parameters of the memory device for performing the different functioning algorithms of the memory in a most efficient manner as possible.

Another object of the invention is to simplify the identification of an optimal configuration of the operating parameters of the memory device during testing.

These important results are achieved by allowing for a one-time processing of configuration bits into "algorithm-friendly" data that are stored in a purposely embedded ancillary random access memory at every power-on of the memory device. This is done by executing a specific power-on algorithm code stored in the ancillary read only memory of the embedded microprocessor.

The ancillary random access memory is capable of storing processed configuration data, and permits a further simplification and quickening of the trimming operations of the device that are performed during the testing phase of the single device being fabricated This is done by supporting an enhanced emulation of the many possible configurations and selectable test parameters for identifying optimal configuration and corresponding operating parameters of the memory device. This is done before the eventual conditioning (e.g., burning) of the corresponding configuration fuses of the fabricated memory device.

DETAILED DESCRIPTION OF THE PREFERRED EMBODIMENTS

Figure 3:
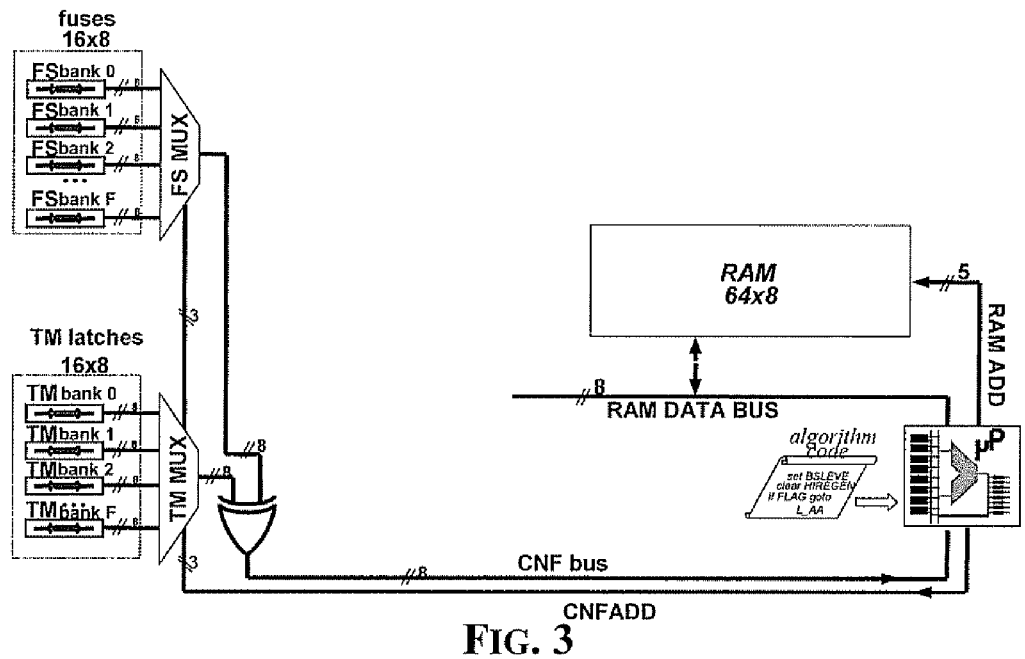
FIG. 3 shows a partial simplified functional scheme, relative to the one time acquisition processing and storing in an ancillary RAN, information contained in the configuration fuses or in simulation latches of the fuses by the microcontroller executing a special power-on algorithm code stored in the ROM at every power-on of the device, according to the present invention.

FIG. 3 illustrates the hardware elements of a multi-level NAND flash memory device with an embedded micro-controller that are involved in the execution of a specific power-on algorithm code at every power-on of the device for processing and storing configuration data in the ancillary random access memory. At every power-on of the device, once the supply voltage has reached a level sufficient to ensure the correct functioning of all logic circuits, a specific algorithm for power-on is executed by the micro-controller μP.

During this phase, the micro-controller μP addresses the plurality of configuration fuses FUSES 16×8, through the address bus CNF-ADD, and reads the relative configuration bit content of the fuses from the CNF-BUS. The information acquired from the configuration fuses of the device is processed into a form more readily usable (algorithm-friendly form) by the control algorithms that are executed during the various operation phases of the memory device. The generated configuration data are recorded in respective locations in the ancillary random access memory RAM 64×8.

This involves a one-time processing of configuration data by the microcontroller μP that will no longer be burdened by repeated tasks of this type during the execution of the control algorithms of operation of the memory device.

Figure 1:
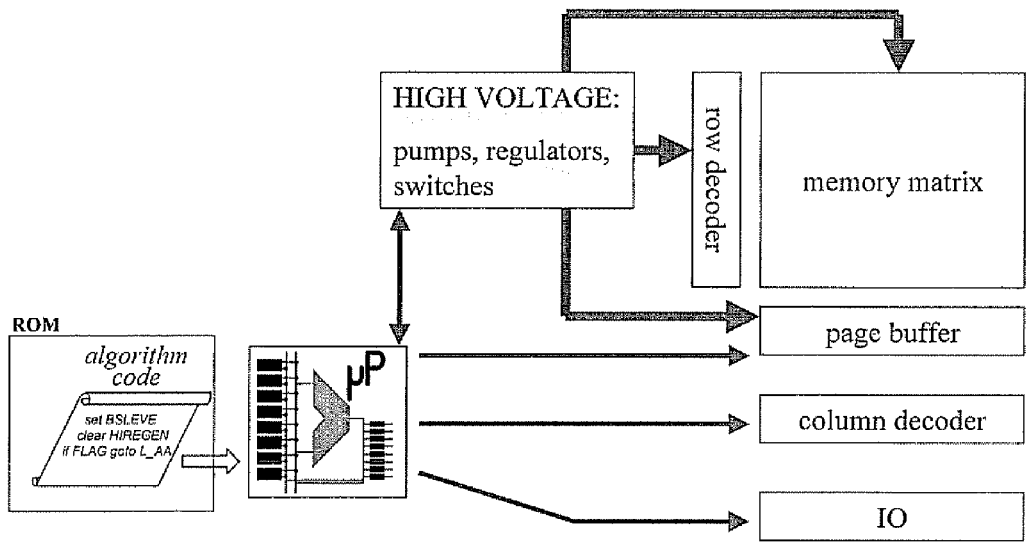
FIG. 1 is a partial simplified functional scheme of a typical multi-level NAND flash memory device with an embedded micro-controller, relative to the managing of the operation phases of the memory circuitry, according to the prior art.
Figure 2:
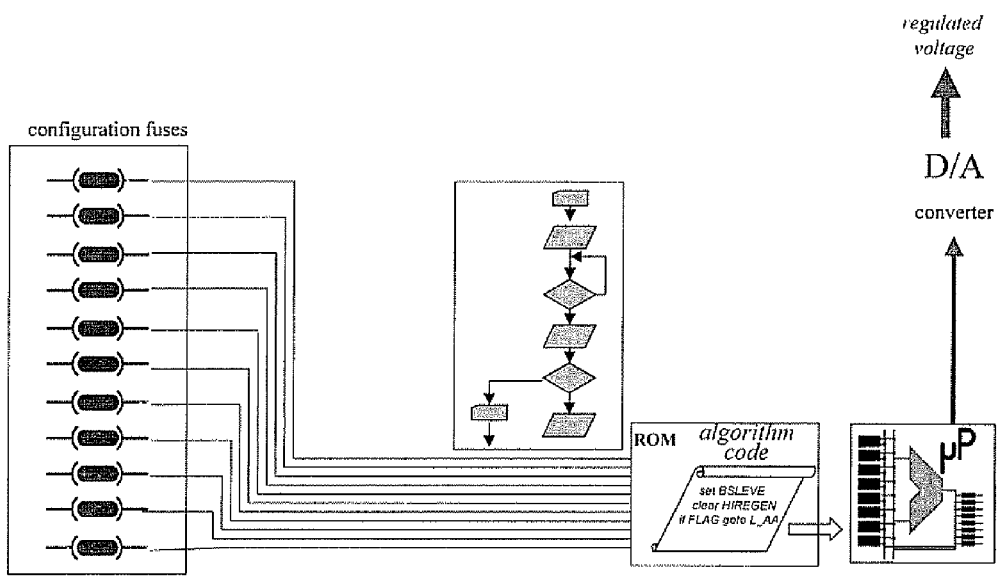
FIG. 2 is a partial simplified functional scheme of the multi-level NAND flash memory device with an embedded micro-controller, relative to the acquisition of the information contained in the configuration fuses by the micro-controller when executing one of the control algorithm codes stored in the ancillary ROM, according to the prior art.
Figure 4:
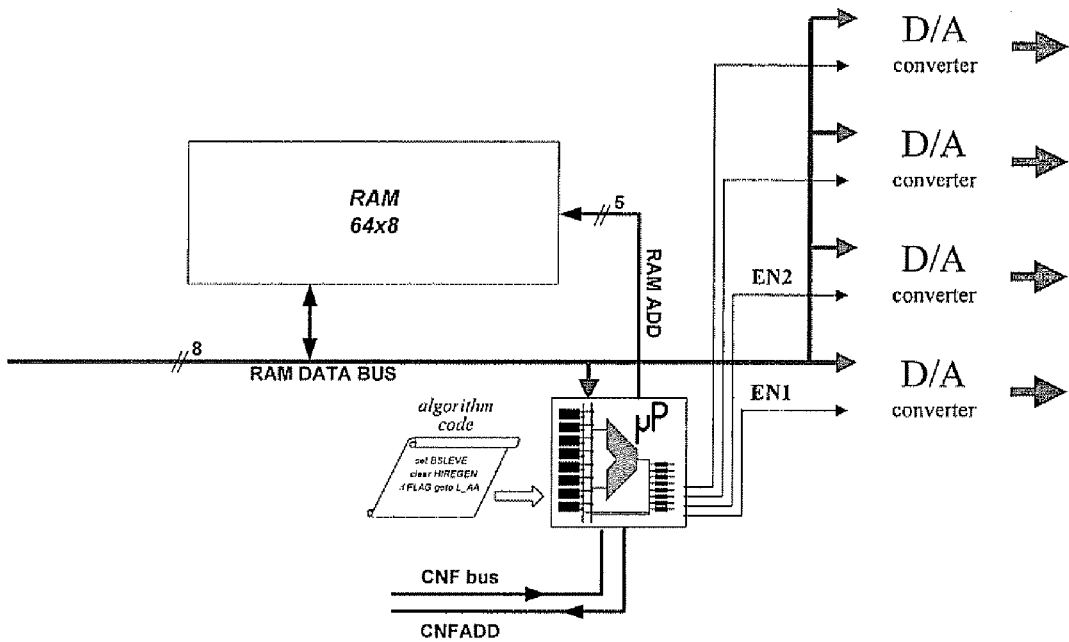
FIG. 4 is a partial diagram of the memory device of FIG. 2 in connection to the execution of a specific algorithm of operation, according to the present invention.

In FIG. 4, the partial diagram of the memory device of FIG. 2 focuses on the hardware elements that thereafter are involved in the execution of a specific algorithm of operation of the memory device. As may be observed, the microcontroller μP uses the one-time processed and stored configuration data by reading them directly from the RAM when needed.

For example, let us suppose that certain configuration information to be read from the fuses be a wait time to be observed during execution of a control algorithm. This is done to ensure completion of the charging of a certain internal node of the memory to the desired voltage. Let us also suppose further that the number of choices that are physically contemplated in the device for setting such a wait time is eight.

During execution of the specific power-on algorithm, the micro-controller reads on a certain bank of fuses the three bits that identify the current configuration of the wait time of interest. To such a selected configuration is associated a certain constant (stored in the ROM containing the algorithm codes). The constant would be, in this case, the number of clock cycles that the microcontroller will remain waiting during the execution of the control algorithm (e.g., a READ, a PROGRAM, AN ERASE or other algorithm) when such a wait time is required for a sufficient charge time for the node to become fully charged.

The number of wait cycles determined during the execution of the special power-on algorithm is stored in a specific location in the ancillary random access memory RAM using a byte for it. An example of execution of a routine of this type during execution of the special power-on algorithm according to the present invention is the following.

tEVAL is the wait time used in running a READ-algorithm. Let us suppose that the selectable wait times were the following eight different values:

| CNF | tEVAL |
|---|---|
| 000 | 4300 ns |
| 001 | 4800 ns |
| 010 | 5300 ns |
| 011 | 5800 ns |
| 100 | 6300 ns |
| 101 | 6800 ns |
| 110 | 7300 ns |
| 111 | 7800 ns |

Assume a clock of 100 ns for the microcontroller operation and that the particular tEVAL routine will last nine cycles (for the various steps) plus the imposed wait cycles. This is done to ensure a wait time of 4300 ns. The number of wait cycles to be set will be given by 4300 ns/100 ns−9=34, that is: CNF=000⇒tEVAL=4300 ⇒34 wait-cycles are needed.

Therefore, if the configuration bits 000 are read from the relative bank of fuses of the device, the code 34 (22 h) for tEVAL is written in a dedicated location of the RAM. Therefore, every time the microcontroller is commanded to execute a READ algorithm, after power-on, the selected wait time of 34 clock cycles is read from the RAM, saving to the microprocessor the reading and processing of the content of the respective configuration fuses.

Another example of processing of configuration fuses information and writing of algorithm friendly processed configuration data in the RAM is the setting of a certain voltage V (R2) to be used in executing a READ algorithm.

Let us suppose that there were four selectable values of such a voltage V(R2), requiring the storage of the selection in two CNF fuses of the device as follows:

| CNF | V(R2) |
|---|---|
| 00 | 1.10 V |
| 01 | 1.20 V |
| 10 | 1.30 V |
| 11 | 1.40 V |

Let us suppose that the device has a digital-to-analog converter (DAC) of the following characteristics: Output voltage=digital-code*50 mV+Voffset, and a Voffset=300 mV. To set V(R2)=1.10V the digital code 16 (CNF 00) must be input to the DAC ((1100 mV−300 mV)/50 mV=16=10 h), that is: CNF=000⇒ V(R2)=1.10V⇒10 h voltage code is required. Therefore, if 00 is read from the CNF-FUSE array, the code 16 (10 h) is written for V(R2) in a dedicated location of the RAM.

According to the present invention, at every power-on of the device, the information contained in the configuration fuses or otherwise stored in programmable latches, as will be described in more detail later, is read and processed by the microcontroller that generates corresponding configuration data that are stored in respective locations in the ancillary configuration RAM.

Therefore, the microprocessor when executing the various control algorithm codes of operation of the memory device uses the one-time processed and stored configuration data, reading them from the RAM. In this way, the microcontroller is no longer required to address the configuration fuses, and to process the configuration information gathered from the fuses during every phase of normal functioning of the memory device.

FIG. 4 illustrates the functional hardware blocks that are involved in the execution of a specific algorithm of operation of the memory device When a specific control algorithm (for example a READ, PROGRAM, ERASE or a certain test routine) is executed by the microcontroller, all information necessary for the execution of the algorithm that depends on the configuration imparted to the device are immediately available from the RAM already in the form of digital values. This is without the need of reading the relative bits of configuration from the fuses or functional storage element, and without having to perform calculations for obtaining them.

In particular, by referring to the first of the two examples described above, during execution of the relative control algorithm, at the moment in which the specified wait time is required, the microcontroller will simply load from the RAM the number of cycles for which it will remain waiting.

With reference to the second example described above, the setting of a certain voltage during execution of a relative control algorithm, the microcontroller will simply convey to the digital-to-analog converter (D/A) the byte read from the RAM.

Alternatively, the byte value stored in the RAM may even be delivered directly from the RAM to the digital-to-analog converter, in which case the microcontroller would limit itself to enable the specific converter at the correct instant to load the configuration value (byte) having the microprocessor coherently addressed by the RAM.

Even the second object is achieved by the multi-level flash memory device with the ancillary random access memory. Indeed, the presence of an embedded ancillary read only memory permitting storage of processed configuration data that is loaded in the RAM by executing a specific power-on algorithm greatly simplifies and speeds-up the testing of a device at the fabrication level.

Figure 5:
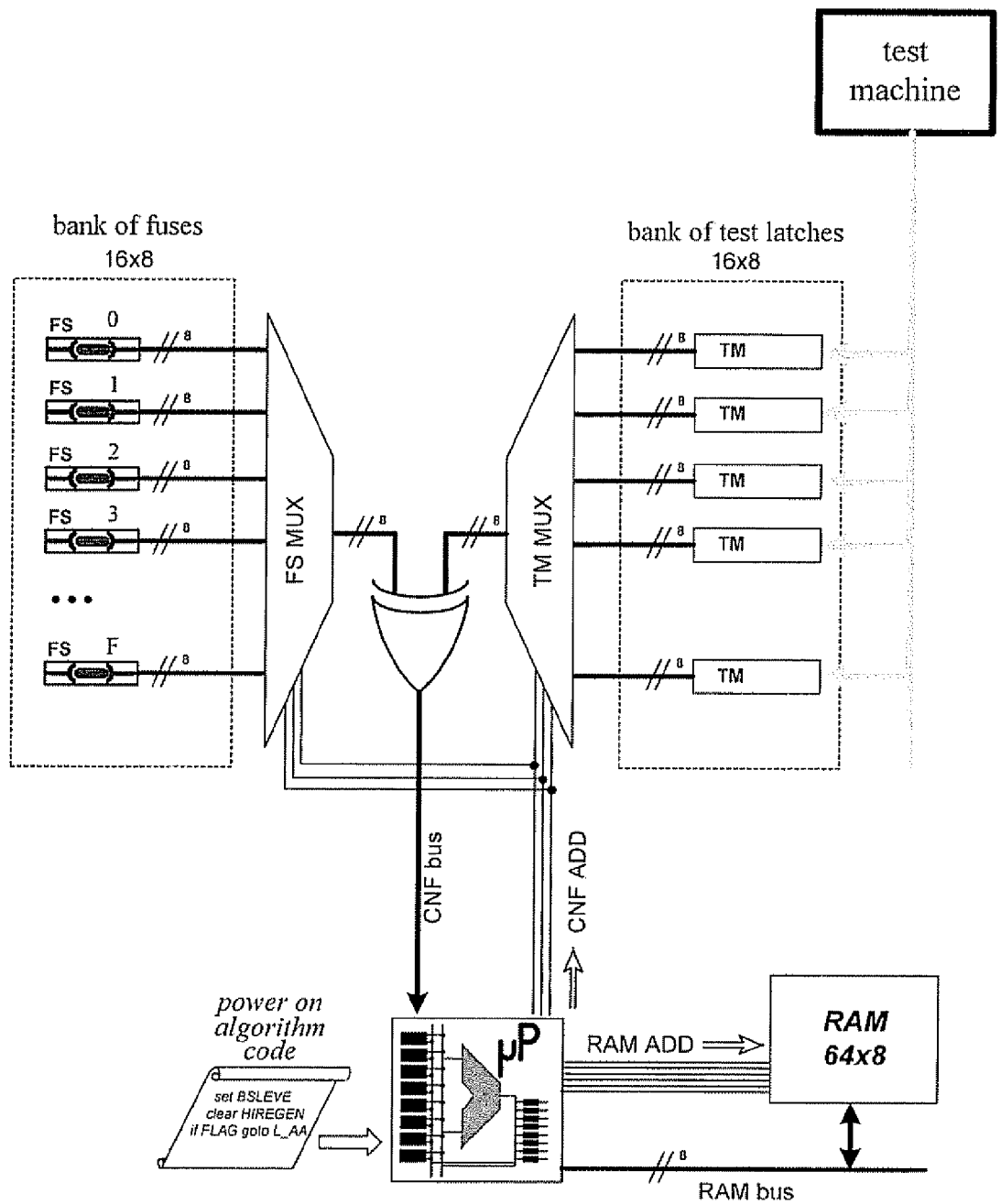
FIG. 5 is a partial diagram of the memory device according to the present invention, in connection to the testing and trimming of the device being fabricated.

According to a first embodiment of the invention relative to the enhancement of the testing procedure will be illustrated with reference to the functional scheme of FIG. 5. According to a known practice, to each configuration fuse FS is associated a storage latch TM. The content of which is XORed with the bit value contained in the corresponding fuse. The one-to-one or bi-univocal association of each fuse with a corresponding latch is implemented through the simultaneous addressing by the microcontroller µP of the two selection multiplexes FS-MUX and TM-MUX. This is during execution of the specific power-on algorithm when the configuration bit values are read, and one-time processed by the microcontroller that stores the processed configuration data in the RAM.

By making it possible for the external test machine TEST MACHINE to write information in the latches TM, it is possible to emulate the effect of burning certain fuses, and therefore, of forcing the functioning of a control algorithm according to a configuration different from the one that would be imposed by the current state of the fuses.

However, to activate such an emulated modification of the configuration, it is necessary that the execution by the microcontroller of an algorithm that emulates the specific power-on algorithm in view of the fact that the writing of the latches for modifying the configuration in a non-permanent (test mode) manner must be done after having already powered on the device. Therefore, by executing a special test mode power-on algorithm, after the external test machine has loaded the new configuration bits in test mode in the latches, the microcontroller will gather the new test mode configuration information, process it and store processed test mode configuration data in the RAM. Such a special test mode power-on algorithm may be launched by the external test machine through a simple sequence of commands. This is done to overwrite configuration data already present in the RAM. For example, it may be written in the RAM upon the first powering on of the device. Therefore, it is dependent on the state of the fuses, or stored in the RAM during the last execution of the special test mode power-on algorithm).

Notwithstanding the fact that this approach makes the testing procedure easier and faster as compared to the prior art situation according to which the microprocessor would have to gather the configuration information from the fuses and/or the latches, process it and generate the corresponding value during execution of each phase of operation of the memory, it does not permit one to test configurations of the device different from the ones that can be eventually selected by the permanent burning of the configuration fuses.

An alternative and more powerful approach is possible by the presence of the ancillary random access memory to permit evaluation of configurations even beyond the limit of those contemplated by the physical realization of a given set of configuration fuses. This possibility may be of great value for gathering valuable information on possible design modifications of a device being developed without limitations of silicon area availability for forming an excessively large number of configurable fuses and/or latches or for deepening investigations on possible reasons of failures of devices returned from the customer-user.

Figure 6:
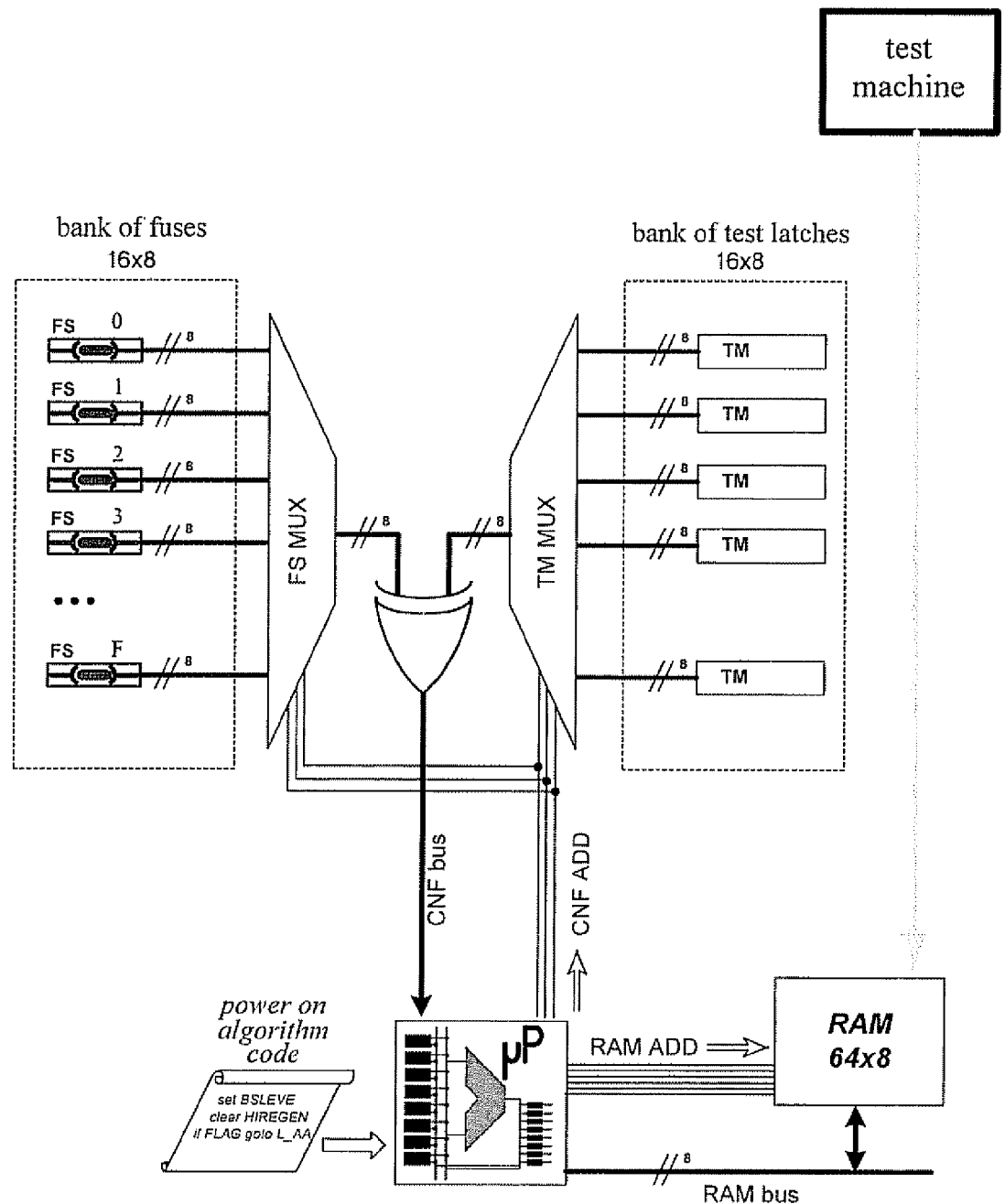
FIG. 6 is a diagram of the memory device according to the present invention, in connection to the structures for executing an extended testing and assessment of alternative configuration choices on the device.

This capability may be achieved by simply realizing in the device means or an interface for permitting the external test machine (TEST MACHINE) to access directly the ancillary read only memory for loading in the respective locations configuration data to be verified. This is schematically illustrated in FIG. 6.

In this way, the alternative configurations (time intervals, voltages, and other parameters) on which the control algorithm of the various phases of operation of the memory device may be tested. Eventually they will no longer be only the ones that may be set by burning the configuration fuses (that typically may offer two, four or at most eight alternative choices for a parameter), but may assume values selectable on a much larger set of possible values. If for a specific configuration parameter all 256 possible values that the byte may assume are reasonable, then the possibility of choice of the parameter value will became one among 256.

Referring to the first of the two examples described above, it would be possible to load in test mode in the RAM any byte as the number of wait cycles during a read operation. If the working frequency of the microcontroller is 10 MHz it will be possible to set this interval in the range from 900 to 26400 ns with a 100 ns granularity. For the second example of a voltage to be used in a read operation, it will be possible to set not only one of the four selectable voltages that could be set through the burning of the fuses, but any of the 256 values of voltage corresponding to the conversion digital-to-analog of a byte value, assuming that the converter is able to accept any configuration.

This powerful method of testing a vast number of different configurations is possible by simply making arrangements in the fabricated device suitable to render possible for the external test machine to directly access the embedded ancillary RAM of the device for writing in it the configuration data to be tested.

That which is claimed:

1. A multilevel memory device comprising:
   a read only memory to store a power-on algorithm code;
   a plurality of addressable configuration fuses to store configuration bits of the multilevel memory device;
   a plurality of addressable latches to store configuration bits, the plurality of addressable latches having a one-to-one correspondence to said plurality of addressable configuration fuses;
   an ancillary random access memory; and
   a microcontroller to execute the power-on algorithm code stored in said read only memory to generate configuration data based on the configuration bits of the plurality of addressable configuration fuses and the plurality of addressable latches, wherein the configuration data is different from the configuration bits and is indicative of either a number of wait cycles related to operation of the microcontroller or a voltage code related to operation of a digital-to-analog converter, and to write the configuration data in the ancillary random access memory to facilitate operation of control algorithms performed during an operation phase of the multilevel memory device.

2. The device according to claim 1, wherein said read only memory and said ancillary random access memory are configured so that the multilevel memory device is a NAND type.

3. A test apparatus comprising:
   a multilevel memory device including
      a read only memory to store an algorithm code,
      a plurality of addressable configuration fuses to store configuration bits of the multilevel memory device,
      a plurality of addressable latches to store configuration bits, the plurality of addressable latches having a one-to-one correspondence to said plurality of addressable configuration fuses,
      an ancillary random access memory, and
      a microcontroller to execute the algorithm code stored in said read only memory to generate configuration data based on the configuration bits stored in the plurality of addressable configuration fuses and the configuration bits stored in the plurality of addressable latches, wherein the configuration data is different from the configuration bits and is indicative of either a number of wait cycles related to operation of the microcontroller or a voltage code related to operation of a digital-to-analog converter, and to write the configuration data in the ancillary random access memory to facilitate operation of control algorithms performed during an operation phase of the multilevel memory device; and
   a test machine to provide the configuration bits in said plurality of addressable latches.

4. The test apparatus according to claim 3, wherein said test machine is coupled to said plurality of addressable latches.

5. The test apparatus according to claim 3, wherein said multilevel memory device further comprises:
   a fuse selection multiplexer coupled to said plurality of addressable configuration fuses;
   a latch selection multiplexer coupled to said plurality of addressable latches; and
   a logic circuit being coupled between said fuse selection multiplexer and said latch selection multiplexer to perform a logic function on a configuration bit of an addressable configuration fuse and a configuration bit of an addressable latch, which corresponds to the addressable configuration fuse.

6. The test apparatus according to claim 5, wherein said fuse and latch selection multiplexers are controlled by said microcontroller upon executing the algorithm code.

7. The test apparatus according to claim 3, wherein the multilevel memory device further comprises
   the digital-to-analog converter to programmably produce a regulated voltage during operation of the multilevel memory device, wherein the configuration data includes the voltage code to be input to the digital-to-analog converter to program the digital-to-analog converter to produce the regulated voltage.

8. The multilevel memory device of claim 1, wherein the configuration bits correspond to a wait time to be used during execution of the control algorithm and the microcontroller is to execute the power-on algorithm code to
   determine the number of wait cycles that corresponds to the wait time; and
   produce the configuration data to be indicative of the number of wait cycles.

9. The multilevel memory device of claim 1, wherein the configuration bits correspond to a voltage level to be used during execution of the control algorithm and the microcontroller is to execute the power-on algorithm code to
   determine the voltage code that, when provided to the digital-to-analog converter, results in an output voltage of the voltage level; and
   produce the configuration data to be indicative of the voltage code.

10. A method of operating a multilevel memory device comprising:
    executing, with a microcontroller, a power-on algorithm code to read configuration bit content stored in a plurality of configuration fuses and in a plurality of latches, which respectively correspond to the plurality of configuration fuses, of the multilevel memory device, to process the configuration bit content of both the plurality of latches and the plurality of configuration fuses in a manner to produce configuration data, and to store the configuration data in an ancillary random access memory of the multilevel memory device, wherein the configuration data is different from the configuration bit content and is indicative of either a number of wait cycles related to operation of the microcontroller or a voltage code related to operation of a digital-to-analog converter; and
    accessing, with the microcontroller, the configuration data through an execution of a control algorithm code during an operation phase of the multilevel memory device.

11. The method of claim 10, wherein the configuration bit content corresponds to a wait time to be used during execution of the control algorithm code and said executing the power-on algorithm code to process the configuration bit content in a manner to produce configuration data comprises:
    determining the number of wait cycles that corresponds to the wait time; and
    producing the configuration data to be indicative of the number of wait cycles.

12. The method of claim 10, wherein the configuration bit content corresponds to a voltage level to be used during execution of the control algorithm code and said executing the power-on algorithm code to process the configuration bit content in a manner to produce configuration data comprises:
  determining the voltage code that, when provided to the digital-to-analog converter, results in an output voltage of the voltage level; and
  producing the configuration data to be indicative of the voltage code.

13. The method of claim 10, wherein said executing the power-on algorithm code to read configuration bit content stored in the plurality of configuration fuses and the plurality of latches comprises:

controlling a fuse selection multiplexor and a latch selection multiplexor to provide respectively corresponding bit values to a logic circuit; and receiving an output of the logic circuit as a configuration bit.

14. The multilevel memory device of claim 9, wherein the ancillary random access memory is configured to provide the voltage code directly to the digital-to-analog converter during the operation phase of the multilevel memory device.

* * * * *

UNITED STATES PATENT AND TRADEMARK OFFICE
CERTIFICATE OF CORRECTION

PATENT NO. : 7,937,576 B2  Page 1 of 1
APPLICATION NO. : 11/460777
DATED : May 3, 2011
INVENTOR(S) : Angelo Bovino et al.

It is certified that error appears in the above-identified patent and that said Letters Patent is hereby corrected as shown below:

On the Title page, in field (57), under "Abstract", in column 2, line 4, after "memory" insert -- . --.

On the Title page, in field (57), under "Abstract", in column 2, line 9, after "memory device" insert -- . --.

Signed and Sealed this
Twelfth Day of July, 2011

David J. Kappos
*Director of the United States Patent and Trademark Office*